US009583183B2

(12) United States Patent
Fainzilber et al.

(10) Patent No.: US 9,583,183 B2
(45) Date of Patent: Feb. 28, 2017

(54) READING RESISTIVE RANDOM ACCESS MEMORY BASED ON LEAKAGE CURRENT

(71) Applicant: SANDISK TECHNOLOGIES INC., Plano, TX (US)

(72) Inventors: Omer Fainzilber, Even Yehuda (IL); Eran Sharon, Rishon Lezion (IL); Idan Alrod, Herzliya (IL); Ariel Navon, Revava (IL); Tz-Yi Liu, Palo Alto, CA (US); Tianhong Yan, Saratoga, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 103 days.

(21) Appl. No.: 14/497,674

(22) Filed: Sep. 26, 2014

(65) Prior Publication Data

US 2016/0093372 A1 Mar. 31, 2016

(51) Int. Cl.

| G11C 29/00 | (2006.01) |
|---|---|
| G11C 13/00 | (2006.01) |
| G06F 11/10 | (2006.01) |
| G11C 11/56 | (2006.01) |
| G11C 16/34 | (2006.01) |
| G11C 29/42 | (2006.01) |
| G11C 29/52 | (2006.01) |
| G11C 16/26 | (2006.01) |
| G11C 29/04 | (2006.01) |
| G11C 29/50 | (2006.01) |

(52) U.S. Cl.
CPC ........ *G11C 13/004* (2013.01); *G06F 11/1048* (2013.01); *G11C 11/5642* (2013.01); *G11C 16/3418* (2013.01); *G11C 29/42* (2013.01); *G11C 29/52* (2013.01); *G11C 16/26* (2013.01); *G11C 2013/005* (2013.01); *G11C 2013/0057* (2013.01); *G11C 2029/0409* (2013.01); *G11C 2029/5006* (2013.01); *G11C 2213/71* (2013.01)

(58) Field of Classification Search
None
See application file for complete search history.

(56) References Cited

U.S. PATENT DOCUMENTS

| 7,372,753 | B1 | 5/2008 | Rinerson et al. | |
|---|---|---|---|---|
| 7,701,761 | B2* | 4/2010 | Pan | G11C 16/30 365/185.02 |
| 2008/0094929 | A1* | 4/2008 | Rinerson | G11C 13/004 365/208 |

(Continued)

*Primary Examiner* — Daniel McMahon
(74) *Attorney, Agent, or Firm* — Toler Law Group, PC

(57) ABSTRACT

A data storage device includes a resistive random access memory (ReRAM). The data storage device includes read circuitry coupled to a storage element of the ReRAM. The read circuitry is configured to read a data value from the storage element, during a read operation, based on a read current sensed during a first phase of the reading operation and a leakage current sensed during a second phase of the reading operation. The data storage device also includes a controller coupled to the read circuitry. The controller is configured to provide an input value to an error correction coding (ECC) decoder, where the input value includes a hard bit value and a soft bit value. The hard bit value corresponds to the data value, and the soft bit value is at least partially based on the leakage current.

36 Claims, 6 Drawing Sheets

(56) References Cited

U.S. PATENT DOCUMENTS

| | | | |
|---|---|---|---|
| 2009/0213639 A1* | 8/2009 | Toda | G11C 13/0002 365/148 |
| 2010/0195384 A1 | 8/2010 | Sharon et al. | |
| 2013/0238955 A1 | 9/2013 | d'Abreu et al. | |
| 2014/0192585 A1* | 7/2014 | Hashim | H01L 45/08 365/148 |
| 2014/0219001 A1* | 8/2014 | Patapoutian | G11C 13/0002 365/148 |
| 2014/0244946 A1* | 8/2014 | Khoueir | G06F 12/00 711/154 |

* cited by examiner

READING RESISTIVE RANDOM ACCESS MEMORY BASED ON LEAKAGE CURRENT

FIELD OF THE DISCLOSURE

The present disclosure is generally related to reading resistive random access memory.

BACKGROUND

Resistance-based random access memory devices use a variable resistive material to store data. The variable resistive material has a resistance that can be changed responsive to a programming voltage. For example, a storage element of a resistance-based random access memory device may be programmed to a first resistance state to indicate storage of a first logical value (e.g., a low resistance state representing a "0" value) and may be programmed to a second resistance state to indicate storage of a second logical value (e.g., a high resistance state representing a "1" value).

Storage elements of a resistance-based random access memory device can be arranged in a three-dimensional structure. In such a structure, each storage element may be placed between a bit line and wordline. For example, a first storage element may be coupled to a first bit line and a first wordline. A second storage element may be coupled to the first bit line and a second wordline. Another storage element may be coupled to a second bit line and the first wordline. In this arrangement, to read the first storage element, a read voltage may be applied across the first storage element by applying a first voltage (e.g., a relatively high voltage) to the first bit line and applying a different voltage (e.g., a relatively low voltage) to the first wordline. A sense amplifier coupled to the first bit line may sense current that flows through the first bit line. The current flowing through the first bit line may correspond to current that flows through the first storage element responsive to the voltage across the first storage element. Thus, the current can be used to determine a resistance state of the first storage element using Ohm's law.

Since the storage elements of the resistance-based random access memory device store logical values based on resistance state, different read currents are used to read different logical values. For example, reading a storage element that is in a low resistance state uses more read current than reading a storage element that is in a high resistance state. However, a reliability of data storage and retrieval at the resistance-based random access memory device may be impacted due to the resistive network topology of the memory, such as by introducing leakage current during read operations and affecting an applied voltage during write operations.

SUMMARY

A data storage device that includes a resistance-based random access memory (ReRAM) is configured to adjust data read operations based on characteristics of non-selected storage elements of the ReRAM. In some implementations, an amount of leakage current sensed during a read operation of a storage element is used to generate reliability information (e.g., "soft bits") for use during decoding at an error correction code (ECC) decoder. Alternatively or in addition, the reliability information for ECC decoding may be generated based on a number of unselected storage elements having the low-resistance state that neighbor the storage element. The number of unselected storage elements having the low-resistance state that neighbor the storage element may be used to determine whether to perform an abbreviated read operation that reduces or omits a leakage current sensing stage when reading the storage element.

DETAILED DESCRIPTION

Figure 1:
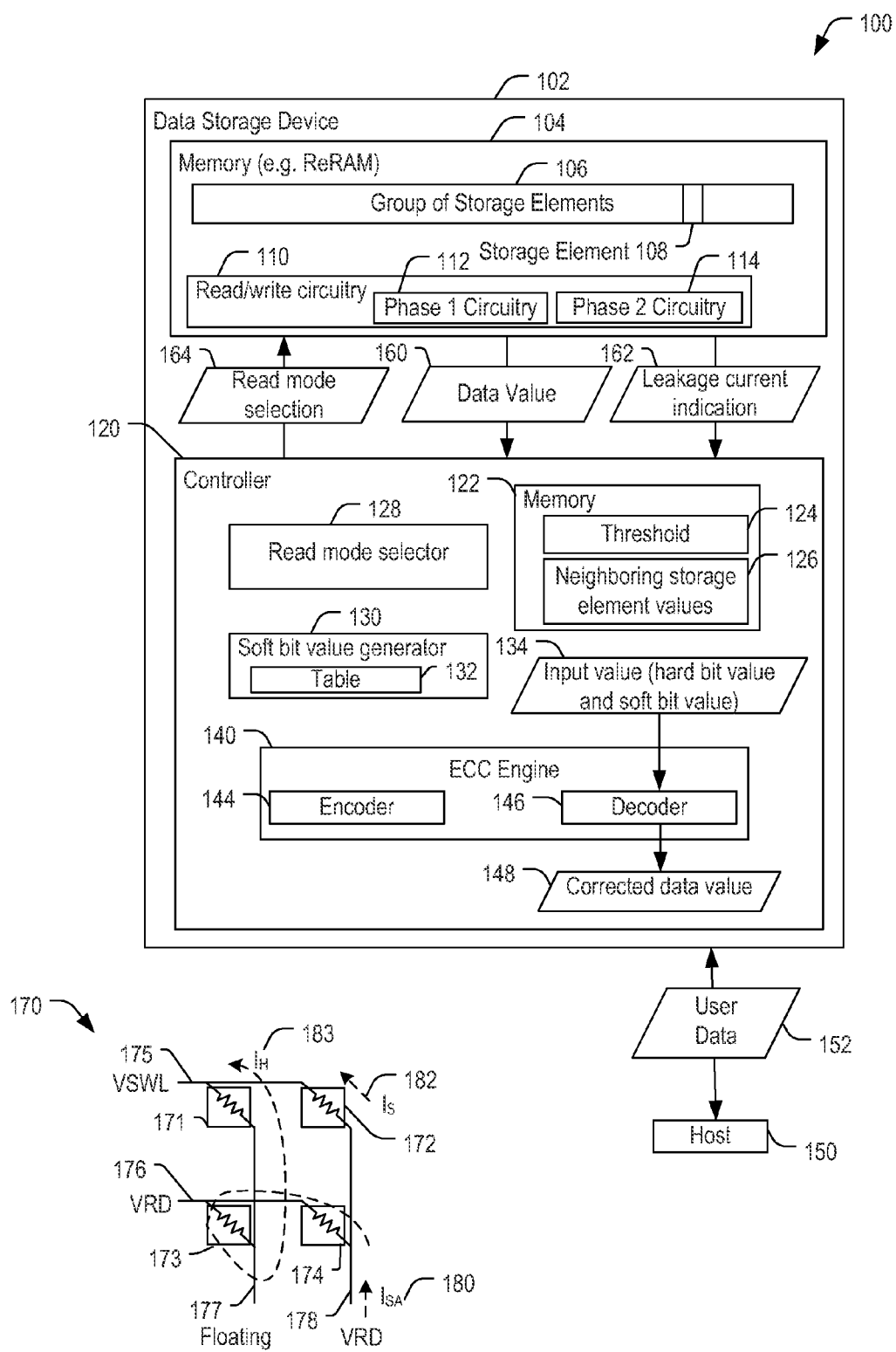
FIG. 1 is a block diagram of a particular illustrative embodiment of a system including a data storage device having a resistance-based memory.

Referring to FIG. 1, a particular illustrative embodiment of a system is depicted and generally designated 100. The system 100 includes a data storage device 102 and a host device 150. The data storage device 102 includes a memory 104, such as a resistance-based random access memory (ReRAM), and is configured to adjust data read operations based on characteristics of non-selected storage elements of the ReRAM.

The data storage device 102 and the host device 150 may be operationally coupled via a connection, such as a bus or a wireless connection. The data storage device 102 may be embedded within the host device 150, such as in accordance with a Joint Electron Devices Engineering Council (JEDEC) Solid State Technology Association Universal Flash Storage (UFS) configuration. Alternatively, the data storage device 102 may be removable from the host device 150 (i.e., "removably" coupled to the host device 150). As an example, the data storage device 102 may be removably coupled to the host device 150 in accordance with a removable universal serial bus (USB) configuration.

The data storage device 102 may include the memory 104 and a controller 120. The memory 104 may include a non-volatile memory, such as a ReRAM. The memory 104 may have a three-dimensional (3D) memory configuration. Alternatively, the memory 104 may have another configuration, such as a two-dimensional (2D) memory configuration. An example of a 3D ReRAM configuration that may implemented in the data storage device 102 is described in further detail with respect to FIG. 2.

The memory 104 may include one or more physical pages of storage elements (e.g., word lines of storage elements). The physical pages may be included in one or more blocks (e.g., a logical or physical group of word lines) of the memory 104. The memory 104 may include multiple blocks of physical pages. A representative group of storage elements 106 may represent a physical page and may be sized to store an error correction code (ECC) codeword. The group of storage elements 106 includes a representative storage element 108, such as a ReRAM cell.

The memory 104 may include read/write circuitry 110. The read/write circuitry 110 may be configured to sense data stored at the memory 104 using a "hard" read technique (e.g., to generate a hard bit having either a logical "0" value or a logical "1" value), a "soft" read technique (e.g., to generate a soft bit indicating a reliability of a sensed value), or a combination thereof. The memory 104 is configured to read data values of storage elements using two-phase read operation. The read/write circuitry 110 includes first phase circuitry 112 that is configured to sense a read current resulting from a applying a read voltage to one of a word line and a bit line that are coupled to a selected storage element during a first phase of a read operation. The read current is indicative of current through the selected storage element and also "leakage" current through one or more non-selected storage elements. The read/write circuity 110 also includes second phase circuitry 114 that is configured to sense leakage current through the non-selected storage elements (and not through the selected storage element) during a second phase of the read operation.

The read/write circuitry 110 is configured to determine a data value 160 stored in the selected storage element by adjusting the read current (sensed in the first phase) to compensate for the leakage current (sensed in the second phase) and may compare the adjusted read current to a threshold to determine if the selected storage element is in the high resistance state or in the low resistance state. The read/write circuitry 110 may be configured to generate a leakage current indication 162 corresponding to the data value 160. For example, the leakage current sensed by the second phase circuitry 114 may be quantized (e.g., via an analog-to-digital (A/D) circuit) to generate one or more bit values that are provided to the controller 120 as the leakage current indication 162.

The controller 120 may include a memory 122, a read mode selector 128, a soft bit value generator 130, and an ECC engine 140. The controller 120 is configured to receive data and instructions from the host device 150 and to send data to the host device 150. For example, the controller 120 may send data to the host device 150 via a host interface (not shown) and may receive data from the host device 150 via the host interface.

The controller 120 is configured to send data and commands to the memory 104 and to receive data from the memory 104. For example, the controller 120 is configured to send data and a write command to cause the memory 104 to store the data to a specified address of the memory 104. The write command may specify a physical address of a portion of the memory 104 (e.g., a physical address of a word line of the memory 104) that is to store the data. The controller 120 is configured to send a read command to the memory 104 to access data from a specified address of the memory 104. The read command may specify the physical address of a portion of the memory 104 (e.g., a physical address of a word line of the memory 104).

The memory 122 may include a random access memory (RAM). Alternatively or in addition, the memory 122 may include another type of memory, such as a nonvolatile memory. The memory 122 may be used to store data for use during reading or decoding of data stored at the memory 104. For example, the memory 122 may include one or more threshold values, such as a representative threshold 124, and neighbor data 126 representing values stored at storage elements that neighbor a particular storage element at the memory 104, such as the storage element 108. Although the neighbor data 126 is described as storing values of neighbors of each particular storage element, in other implementations the neighbor data 126 may store a count (e.g., a counter value) of a number of neighbors of the particular storage element that have a particular state (e.g., a low-resistance state).

The ECC engine 140 is configured to receive data and to generate one or more ECC codewords based on the data. The ECC engine 140 may include an encoder 144 and a decoder 146. For example, the encoder 144 may be configured to encode data using a low-density parity check (LDPC) encoding technique. The encoder 144 may include a Hamming encoder, a Reed-Solomon (RS) encoder, a Bose-Chaudhuri-Hocquenghem (BCH) encoder, an LDPC encoder, a turbo encoder, an encoder configured to encode data according to one or more other ECC techniques, or a combination thereof. The ECC engine 140 is configured to decode data accessed from the memory 104. For example, the decoder 146 within the ECC engine 140 may be configured to decode data accessed from the memory 104 to detect and correct one or more errors that may be present in the read data, up to an error correcting capacity of the particular ECC scheme.

The decoder 146 may support soft decoding that uses data values ("hard bits") and reliability information ("soft bits") for each data value as inputs and performs an iterative decoding process, such as a belief-propagation scheme, that updates data values based at least partially on how reliable or unreliable the data value is considered to be. Upon converging to a valid codeword, the decoder 146 generates an output that may include one or more corrected data values. As used herein, a "corrected data value" may correspond to a data value (e.g., a bit value or non-binary symbol) forming part of a valid ECC codeword output by the ECC engine 140. That is, a corrected data value for a particular bit or symbol in the output of the ECC engine may or may not match an input data value for the bit or symbol that is provided as an input to the ECC engine 140.

The soft bit value generator 130 may be configured to generate reliability information, such as one or more soft bits, for a data value read from the memory 104. In some implementations, the soft bit value generator 130 may receive the leakage current indication 162 from the memory 104 and may generate one or more soft bits based on the leakage current. For example, the leakage current indication 162 may be provided as in input to a table 132, such as a lookup table, and a soft bit value corresponding to the input may be output from the table 132. An example implementation of the table 132 is described in further detail with respect to FIG. 3.

Alternatively or in addition, the soft value generator 130 may generate reliability information based on states of non-selected storage elements that neighbor the storage element that stores the data value. To illustrate, a diagram 170 depicts an example of a portion of a 3D ReRAM memory according to a particular implementation. Storage elements 171 and 172 are coupled to a word line 175 and storage elements 173 and 174 are coupled to another word line 176 that is adjacent to the word line 175. The storage elements 171 and 173 are coupled to a bit line 177 and the storage elements 172 and 174 are coupled to another bit line 178 that is adjacent to the bit line 177. When the storage element 172 is selected to be read ("selected storage element"), a read voltage is applied between the bit line 178 ("selected bit line") and the word line 175 ("selected word line"), illustrated as the selected bit line 178 having a read voltage VRD and the selected word line 175 coupled to a selected word line voltage (VSWL). The unselected bit line 177 is floating (e.g., not coupled to any external voltage source) and the unselected word line 176 is biased with the read voltage VRD.

A total current $I_{SA}$ 180 through the selected bit line 178 (and/or through the selected word line 175) includes a current $I_s$ 182 through the selected storage element 172 and leakage current through unselected storage elements. The total current $I_{SA}$ 180 may be sensed, such as via a sense amplifier of the read/write circuitry 110, during a first phase of a read operation.

One component $I_H$ 183 of the leakage current follows a leakage current path from the selected bit line 178 through the storage element 174, the unselected word line 176, the storage element 173, the unselected bit line 177, and the storage element 171. $I_H$ 183 results from a voltage difference between VRD and VSWL applied across a resistance that is a function of the resistances of the storage elements 174, 176, and 175. $I_H$ 183 is greatest when each of the storage elements 174, 176, and 175 is in a low resistance state. $I_H$ 183 has a smallest magnitude when each of the storage elements 174, 176, and 175 is in a high resistance state.

A total leakage current may be determined as the sum of all leakage current through all possible leakage paths. However, a greatest portion of the leakage current occurs along the shortest leakage paths through storage elements that neighbor the selected storage element 172. Because the amount of leakage current along such paths varies based on the resistance states of the neighboring storage elements, leakage current may be approximated based on a count of neighboring storage elements that are in the low resistance state (or a proportion of the neighboring storage elements that are in the low resistance state).

The soft bit value generator 130 may be configured to access the neighbor data 126 in the memory 122 to identify neighboring storage elements that are in the low resistance state and compare the number of identified neighboring storage elements to the threshold 124. The soft bit value generator 130 may generate a soft bit value based on a result of the comparison so that a first soft bit value indicating a relatively high leakage current is provided to the decoder 146 when the number of identified neighboring storage elements having the low resistance state exceeds the threshold 124, and a second soft bit value indicating a relatively low leakage current is selected otherwise. As another example, soft bit value generator 130 may be configured to generate or select soft bit values based on a proportion of the neighboring storage elements that have a particular state (e.g., the low resistance state).

The read mode selector 128 may be configured to generate a read mode selection 164 that is provided to the read/write circuitry 110. In addition to being indicative of leakage current associated with reading the storage element, the number of neighboring storage elements that are in the low resistance state may also be used to predict a reliability associated with writing data to the selected storage element. For example, when the number of neighboring storage elements of a selected storage element that are in the low resistance state is low, the selected storage element is predicted to have a relatively high reliability, since in this case the leakage current is likely to be low. Thus, when a storage element is predicted to have high reliability, the second phase of the read operation may be adjusted or omitted to reduce latency associated with performing the second phase.

The read mode selector 128 may be configured to predict a reliability of a selected storage element based on a number of neighboring storage elements that are in the low resistance state. To illustrate, when a data value was stored in the selected storage element, a voltage drop across a write voltage path that includes the selected storage elements may be affected by the number of storage elements on the voltage path that have the low resistance state.

The read mode selector 128 may be configured to access the neighbor data 126 in the memory 122 to identify neighboring storage elements that are in the low resistance state and compare the number of identified neighboring storage elements to the threshold 124 (or to one or more other thresholds). The read mode selection 164 may be based on a result of the comparison so that a first read mode that includes a leakage current detection phase is selected when the number of neighboring storage elements having the low resistance state exceeds the threshold 124, and a second read mode is selected otherwise. In the second read mode, the read operation may not include the leakage current detection phase. Alternatively, in the second read mode, the leakage current detection phase is performed at a second resolution that is less than a first resolution of the leakage current detection phase that is used during the first read mode. In some implementations, the read mode selector 128 may be configured to select between the read modes based on a proportion of the neighboring storage elements that have a particular state (e.g., the low resistance state) instead of based on a comparison to the threshold 124.

The host device 150 may correspond to a mobile telephone, a music player, a video player, a gaming device or console, an electronic book reader, a personal digital assistant (PDA), a computer, such as a laptop, a tablet, or a notebook computer, a portable navigation device, another electronic device, or a combination thereof. The host device 150 may communicate via a host controller, which may enable the host device 150 to communicate with the data storage device 102. The host device 150 may operate in compliance with a JEDEC Solid State Technology Association industry specification, such as an embedded MultiMedia Card (eMMC) specification or a Universal Flash Storage (UFS) Host Controller Interface specification. The host device 150 may operate in compliance with one or more other specifications, such as a Secure Digital (SD) Host Controller specification as an illustrative example. Alternatively, the host device 150 may communicate with the data storage device 102 in accordance with another communication protocol.

In operation, the controller 120 may receive data (such as user data 152) from the host device 150. The controller 120 may input the data to the encoder 144 to generate one or more ECC codewords. For example, the encoder 144 may encode the data using an LDPC encoding technique to generate one or more ECC codewords.

The controller 120 may store the one or more ECC codewords to one or more storage elements, such as the group of storage elements 106, of the memory 104. After storing the one or more ECC codewords, the controller 120 may receive a request for read access to data, such as the user data 152, from the host device 150. In response to receiving the request for read access, the controller 120 may cause the read/write circuitry 110 to perform a read operation.

For example, the controller 120 may send one or more control signals to the read/write circuitry 106. The one or more control signals may indicate a physical address associated with a particular storage element 108. The controller 120 may also provide a read mode selection indication 164 to the memory 104. The read mode selection indication 164 may indicate whether the read/write circuitry 110 is to use a first read mode or a second read mode. To illustrate, the read mode selector 128 may access the neighbor data 126 in the memory 122 and compare the number of neighboring storage elements having the low resistance state to the threshold 124 to determine whether the first read mode or the second read mode is to be used.

The read/write circuitry 110 may read each storage element of the group 106 via a series of sequential read operations (e.g., sequentially biasing each bit line 177, 178) to generate and sense a read current for each storage element in a first phase and a leakage current (optionally, or at varying resolution based on the read mode) in a second phase of the read operation. The hard bits for each the storage elements of the group 106 may be provided to the controller 120 as the data value 160 and the leakage current sensed for each of the storage elements of the group (if sensed during the second phase) may be indicated to the controller 120 as the leakage current indication 162.

The controller 120 may generate the input value 134 to the decoder 146 including a hard bit based on the data value 160 and one or more soft bits based on the leakage current indication 162. For example, the input value 134 may include a hard bit and one or more soft bits for each storage element in the group 106. In some implementations, the leakage current indication 162 may correspond to a quantized leakage current measurement and be directly provided to the decoder 146 as the one or more soft bits. In other implementations, the soft bits may be generated by the soft bit value generator 130. For example, the leakage current indication 162 may be used as an input to the table 132 to locate a corresponding table entry and one or more soft bits may be read from the located table entry. As another example, the soft bit value generator 130 may generate the one or more soft bits based on neighboring storage elements having the low resistance state, such as via accessing the memory 122 and performing a comparison using the threshold 124. In such an implementation, the one or more soft bit values may be determined independent of sensing any leakage current, such as when the second read mode is used, or may be determined based on a combination of the sensed leakage current and an analysis of states of neighboring storage elements.

The decoder 146 may use the input value 134 to initialize a value for each bit (or multi-bit symbol), such as to initialize values of variable nodes of an iterative belief-propagation decoding process, and may iteratively check and update the values until converging to a valid ECC codeword and generating the corrected data value 148 (e.g., the user data 152).

In the event that a valid ECC codeword cannot be determined, such when a number of errors that exist in the input value 134 exceeds a correction capacity of the ECC encoding scheme, the controller 120 may re-read the group 106 and/or re-attempt to decode the received data value 160 in a "heroics" mode. Because failure to recover data may occur very infrequently, the controller 120 may dedicate additional power and time resources in the heroics mode without significantly impacting an overall read latency and power consumption of the data storage device 102.

The heroics mode may include performing one or more read operations using a highest resolution available to the data storage device 102. For example, if a first reading of data from the group 106 is performed using the second read mode, a second reading of the data in the heroics mode may be performed using the first read mode with an enhanced resolution of leakage current sensing as compared to the second read mode. Alternatively, or in addition, prior to reading the data from the group 106 in the heroics mode, data may be read from storage elements in one or more neighboring word lines and/or bit lines to populate the neighbor data 126 to enable enhanced estimation of write reliability and/or to enable enhanced read reliability due to the number (or proportion) of neighboring storage elements having low resistance states. By generating soft bits for each data value using such enhanced estimation techniques, a more accurate initial reliability of each data value may be used by the ECC decoder 146 to increase a likelihood of converging to a valid ECC codeword.

Although the leakage current sensed for each of the storage elements of the group (if sensed during the second phase) may be indicated to the controller 120 as the leakage current indication 162, in other implementations the leakage current indication 162 may not indicate leakage current for each storage element in a group. For example, the leakage current indication 162 may include a single value per group of storage elements, such as a single value indicating an average or representative leakage current of storage elements along a particular word line or finger of the memory 104 or along a bit line of the memory 104, as illustrative, non-limiting examples. Reducing a number of leakage current values transmitted from the memory 104 to the controller 120 during a read operation enables the controller 120 to infer reliability information of stored data and may reduce read latency associated with data transfer and/or enable implementations using reduced bus bandwidth.

Although population of the neighbor data 126 is described with reference to the heroics mode, the neighbor data 126 may be populated in other circumstances with little or no additional impact on latency and/or power consumption. For example, when a series of read operations are performed to sequentially addressed word lines of the memory 104 (i.e., adjacent word lines that may have sequential physical addresses), data read from each particular word line may be stored in the memory 122 at least temporarily to be used for reading data from the next sequential word line.

For example, in an implementation where the physical address of the storage elements in the diagram 170 are ordered so that word line 176 is read before word line 175 and so that storage elements are read from left to right along each word line, data from approximately half the storage elements neighboring the selected storage element 172 may be available when the selected storage element 172 is read. To illustrate, the memory 122 may store data values of neighboring storage elements from the previously read word line 176 (e.g., storage elements 173 and 174) and of previously read storage elements from the word line 175 (e.g., storage element 171) when storage element 172 is read. A value of the threshold 124 may be adjusted based on the reduced number of neighboring storage elements that are used for determining read reliability (e.g., by the soft bit value generator 130) and/or for determining write reliability (e.g., by the read mode selector 128) as compared to a value of the threshold 124 that may be used when all neighboring storage elements are used (e.g., in the heroics mode).

Although the data storage device 102 is illustrated as including the read mode selector 128 and the soft bit value generator 130, in other implementations one or both of the read mode selector 128 and the soft bit value generator 130 may be omitted. For example, in an embodiment where the leakage current indication 162 includes a quantized leakage current measurement and is provided as the soft bit value to the decoder 146, the soft bit generator 130 may be omitted and the read mode selector 128 may be used in some implementations and omitted from other implementations.

In an embodiment where the soft bit value generator 130 determines soft bit values based on the neighbor data 126, the leakage current indication 162 may be omitted and the read mode selector 128 may be used in some implementations and omitted from other implementations.

FIG. 1 illustrates example operations and structures that may improve performance of a decoder. For example, data reliability may be more accurately estimated via generation of soft bits based on quantized leakage current and/or based on resistance states of neighboring storage elements. As another example, read latency may be improved by omitting or reducing a resolution of a leakage current sensing phase of a read operation when a storage element is estimated to be reliable based on resistance states of neighboring storage elements. Additional illustrative examples are described further with reference to FIGS. 2-6.

Figure 2:
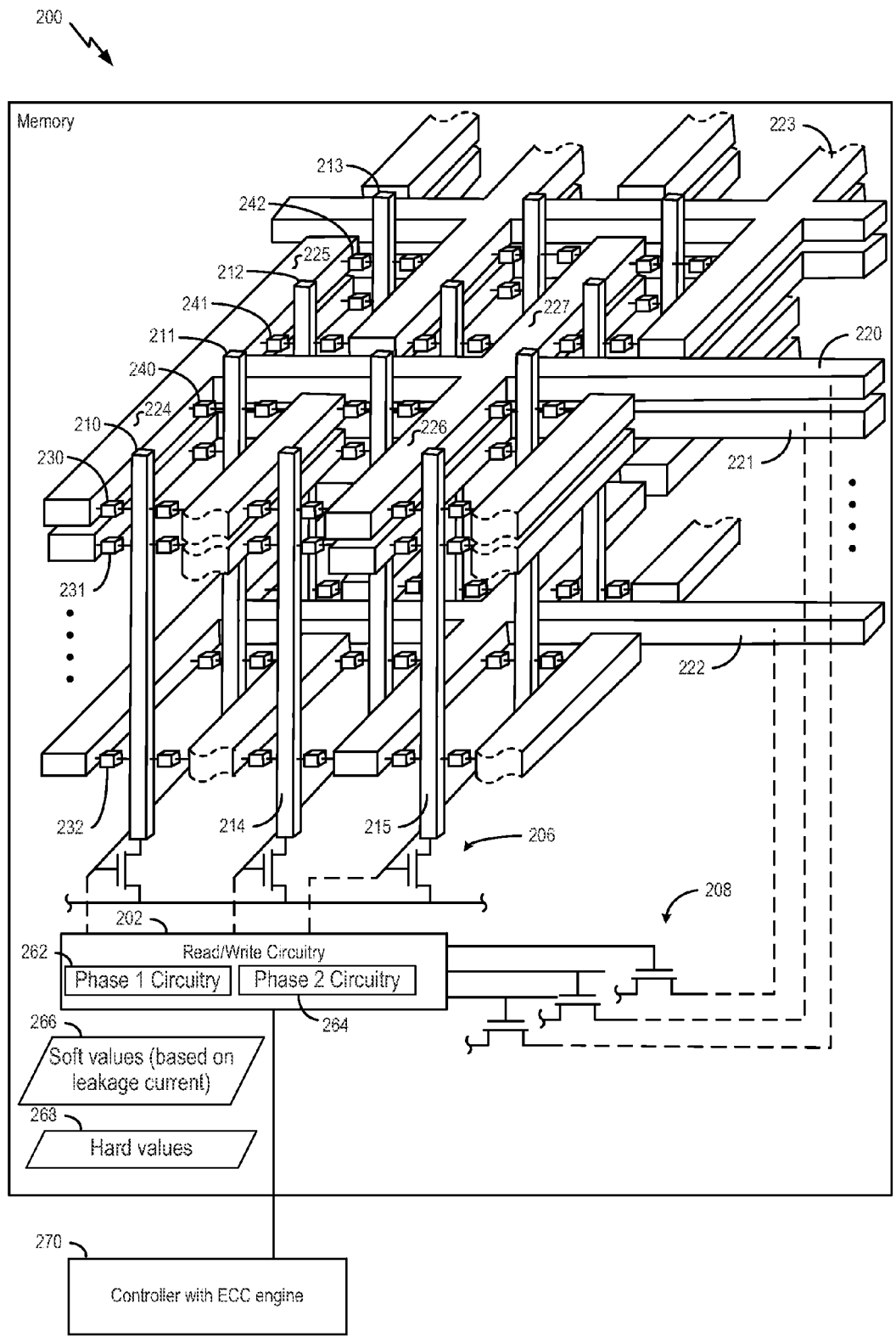
FIG. 2 is a block diagram of particular embodiment of a memory that may be included in the data storage device of FIG. 1.

FIG. 2 is a diagram of a particular embodiment of a memory 200. The memory 200 may correspond to the memory 104 of FIG. 1. FIG. 2 illustrates a portion of a three-dimensional architecture of the memory 200 according to a particular embodiment. In the embodiment illustrated in FIG. 2, the memory 200 is a vertical bit line resistive random access memory (ReRAM). In addition, the example of FIG. 2 illustrates that the memory 200 may communicate with a controller 270 that includes an ECC engine. For example, the memory 200 may send data to and receive data from the controller 120 of FIG. 1, which includes the ECC engine 140. In one or more other implementations, the memory 200 may include an ECC engine, such as the ECC engine 140 of FIG. 1.

The memory 200 may include a plurality of conductive lines in physical layers over a substrate (e.g., substantially parallel to a surface of the substrate), such as representative word lines 220, 221, 222, and 223 (only a portion of which is shown in FIG. 2). The memory 200 may further include a plurality of vertical conductive lines through the physical layers, such as representative bit lines 210, 211, 212, 213, 214 and 215. The memory 200 also includes a plurality of resistance-based storage elements (e.g., memory cells), such as representative storage elements 230, 231, 232, 240, 241, and 242, each of which is coupled to a bit line and a word line in arrays of memory cells in multiple physical layers over the substrate (e.g., a silicon substrate).

The memory 200 also includes read/write circuitry 202. The read/write circuitry 202 may correspond to the read/write circuitry 110 of FIG. 1. The read/write circuitry 202 is coupled to word line drivers 208 and bit line drivers 206.

In the embodiment illustrated in FIG. 2, each of the word lines includes a plurality of fingers. For example, a first word line 220 includes fingers 224, 225, 226, and 227. Each finger may be coupled to more than one bit line. To illustrate, a first finger 224 of the first word line 220 is coupled to a first bit line 210 via a first storage element 230 at a first end of the first finger 224 and is coupled to a second bit line 211 via a second storage element 240 at a second end of the first finger 224.

In the embodiment illustrated in FIG. 2, each bit line may be coupled to more than one word line. To illustrate, the first bit line 210 is coupled to the first word line 220 via the first storage element 230 and is coupled to a third word line 222 via a third storage element 232.

During a write operation, the controller 270 may receive data from a host device, such as the host device 150 of FIG. 1. The controller 270 may send the data (or a representation of the data) to the memory 200 to be stored. In a particular embodiment, the ECC engine of the controller 270 encodes the data (e.g., to generate an ECC codeword), and the controller 270 sends the ECC codeword to the memory 200 to be stored.

During a read operation, the controller 270 may receive a request from a host device, such as the host device 150 of FIG. 1. The controller 270 may cause the read/write circuitry 202 to read a data value from a particular storage element of the memory 200 by applying selection signals to selection control lines coupled to the word line drivers 208 and the bit line drivers 206 to cause a read voltage to be applied across a selected storage element. For example, to select the first storage element 230, the read/write circuitry 202 may activate the word line drivers 208 and the bit line drivers 206 to apply a first voltage (e.g., VRD) to the first bit line 210 and to word lines other than the first word line 220. A lower voltage (e.g., VSWL) may be applied to the first word line 220. Thus, a read voltage is applied across the first storage element 230, and a read current corresponding to the read voltage may be detected at a sense amplifier of the read/write circuitry 202. The read current corresponds (via Ohm's law) to a resistance state of the first storage element 230, which corresponds to a logical value stored at the first storage element 230.

The read/write circuitry 202 may include first phase circuitry 262 and second phase circuitry 264 that may correspond to the first phase circuitry 112 and the second phase circuitry 114 of FIG. 1, respectively. The logical value read from the first storage element 230 may be provided to the controller 270 in a set of hard values 268 for decoding by the ECC engine. Other information may also be provided to the controller 270 by the memory 200, or by the controller 270 to the ECC engine. For example, one or more soft values based on leakage current sensed by the second phase circuitry 264 may be provided in a set of soft values 266 for use by the ECC engine. The ECC engine 120 may decode the logical values (e.g., based on the soft bits) to generate decoded data. The decoded data may include one or more corrected data values.

Figure 3:
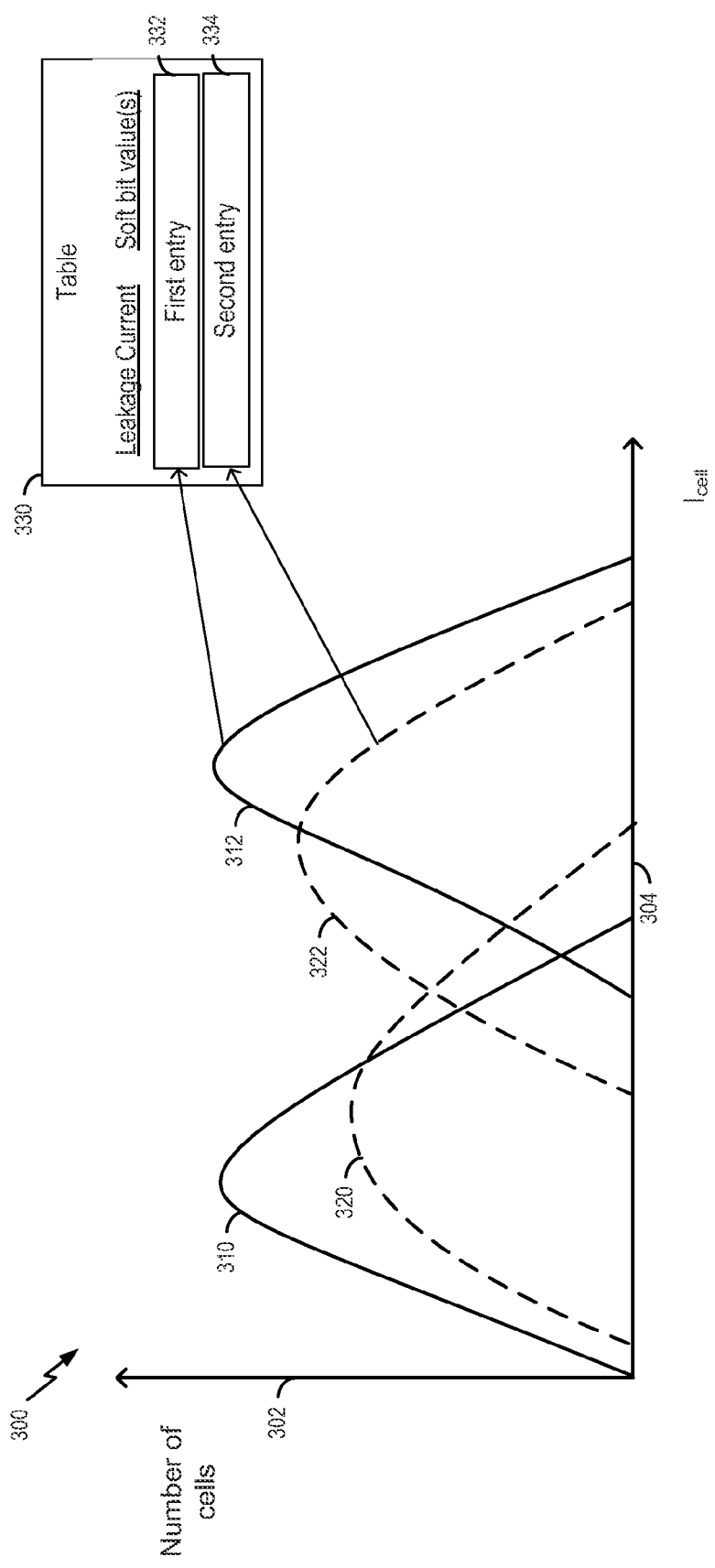
FIG. 3 is a graph illustrating multiple cell current distributions corresponding to soft bit values that may be used by the data storage device of FIG. 1.

Referring to FIG. 3, a graph 300 depicts a first cell current distribution (solid lines) and a second cell current distribution (dashed lines) that may correspond to storage elements of the memory 104 of FIG. 1 or the memory 200 of FIG. 2. The first distribution has a first lobe 310 indicating a high resistance state (and therefore low read current) and a second lobe 312 indicating a low resistance state (and higher read current). The second distribution has a first lobe 320 indicating the high resistance state and a second lobe 322 indicating the low resistance state. Regions of overlap between the lobes 310 and 312, or between the lobes 320 and 322, indicate storage elements whose states cannot be accurately determined and are therefore less reliable than storage elements outside the regions of overlap. As illustrated, the first cell current distribution has a smaller overlap area and is therefore more reliable on average than the second cell current distribution.

In addition, if a state of a storage element is determined by comparing the read current to a reference current that is set at the cross-over point of the lobes 310 and 312, a number of storage elements in the first lobe 310 that are incorrectly read as having the low resistance state approximately matches the number of storage elements in the second lobe 312 that are incorrectly read as having the high resistance state. As a result, a probability of "zero-to-one" errors approximately equals a probability of "one-to-zero" errors in the first distribution. However, reading storage elements of the second distribution using the same reference current would result in a greater number of storage elements in the second lobe 322 being erroneously read as having the high-resistance state as compared to storage elements in the first lobe 320 that are erroneously read as having the low-resistance state. As a result, a probability of "zero-to-one" errors may not approximately equal a probability of "one-to-zero" errors in the second distribution.

The first distribution may be characterized as having, on average, a lower read leakage current as compared to a higher read leakage current that may characterize the second distribution. For example, the first distribution may correspond to storage elements that are programmed while most or all neighboring storage elements are mostly in the high resistance state, and the second distribution may correspond to storage elements that are programmed while most or all neighboring storage elements are in the low resistance state. The soft bit value generator 130 of FIG. 1 may estimate whether a selected storage element corresponds to the first distribution or the second distribution based on the leakage current indication 162 and may select a corresponding entry from a table 330. Alternatively or additionally the first distribution may correspond to storage elements that are read while most or all neighboring storage elements are mostly in the high resistance state, and the second distribution may correspond to storage elements that are read while most or all neighboring storage elements are in the low resistance state.

For example, the table 330 may correspond to the table 132 of FIG. 1 and may include a first entry 332 that includes soft bit values corresponding to the first distribution and a second entry 334 that includes soft bit values corresponding to the second distribution. The soft bit value generator 130 may compare the leakage current indication 162 to a threshold and select the first entry 332 for the selected storage element in response to the leakage current indication 162 being less than or equal to the threshold, or may select the second entry 334 in response to the leakage current indication 162 being greater than the threshold. Alternatively or in addition, the soft bit generator 130 may select the first entry 332 or the second entry 334 based on resistance states of neighboring storage elements, as described above.

The entries 332, 334 may include soft bit values indicative of the difference in overall reliability of the two distributions and/or indicative of the symmetry or asymmetry of zero-to-one and one-to-zero error likelihood within the distributions. To illustrate, the first entry 332 may provide soft bits indicating a first reliability for storage elements that are read as being in the high resistance state and for storage elements that are read as being in the low resistance state. The second entry 334 may provide soft bits indicating a second reliability for storage elements that are read as being in the low resistance state and a third reliability for storage elements that are read as being in the high resistance state, where the first reliability is higher than the second reliability, and the second reliability is higher than the third reliability.

Although FIG. 3 illustrates two distributions, in other implementations more than two distributions may be used and the table 330 may include one or more additional entries corresponding to the additional distributions. In addition, although each distribution is illustrated as including two lobes (e.g., a single level cell (SLC) implementation where each storage element stores a single bit), in other embodiments each storage element may store more than a single bit and each distribution may have more than two lobes. Although the soft bits in the table entries 332, 334 may be set by a provider of the data storage device 102 based on measured or modeled cell current distributions, in other implementations the data storage device 102 may be configured to measure cell current distributions at one or more intervals during the life of the data storage device 102 and to update soft bit values in the table 330 as the memory 104 ages. Although the soft bit values of the entries 332, 334 are described as being based on characteristics of the cell current distributions, in other implementations one or more soft bit values of the entries 332, 334 may instead be based on other factors, such as empirically determined based on one or more criteria (e.g., resulting in the fewest ECC failures under device end-of-life conditions as compared other tested soft bit values).

Figure 4:
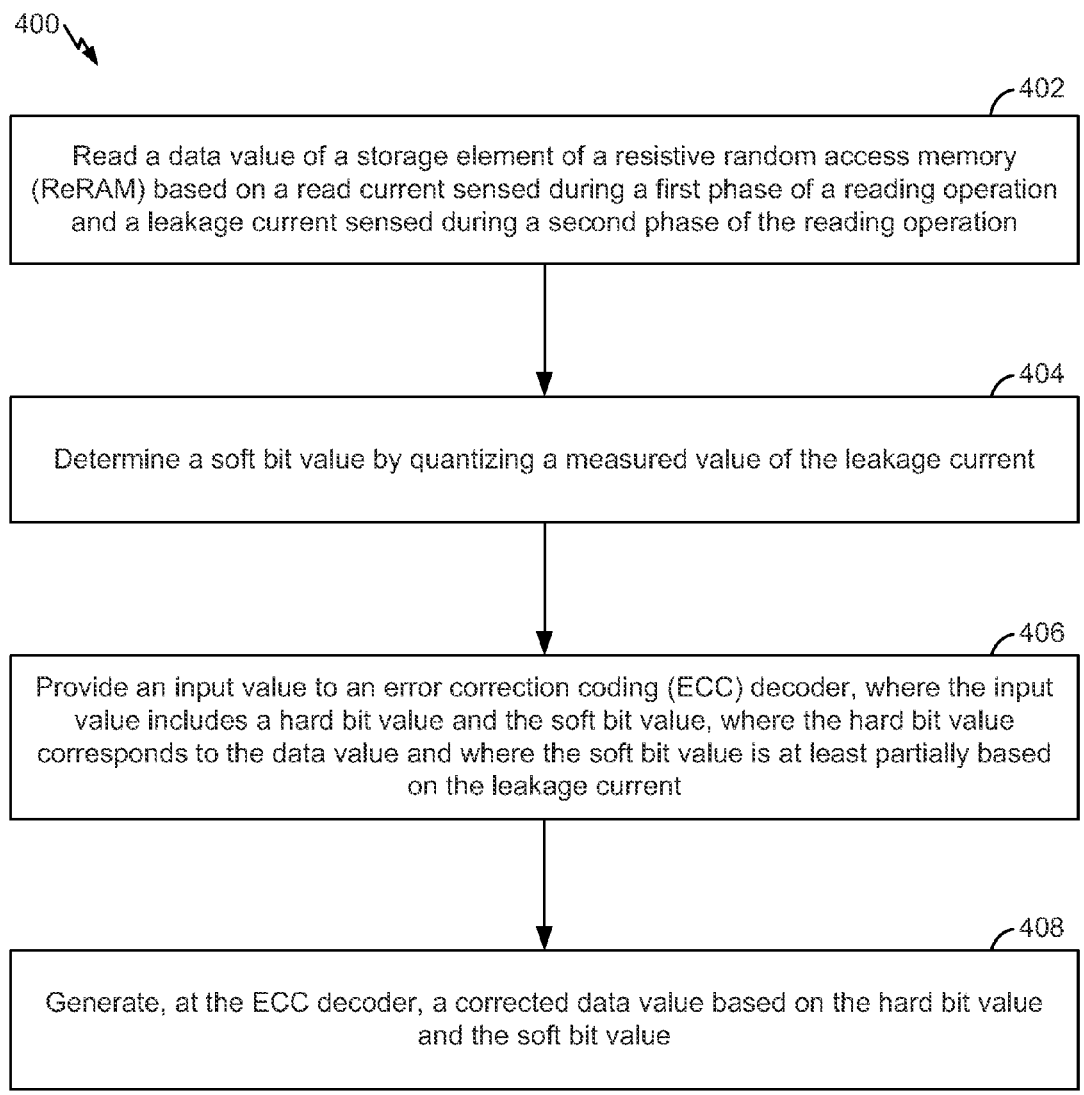
FIG. 4 is a flow diagram that illustrates a particular example of a method of operation of the data storage device of FIG. 1.

Referring to FIG. 4, a particular illustrative embodiment of a method is depicted and generally designated 400. The method 400 may be performed at the data storage device 102, such as by the read/write circuitry 110, the controller 120, the decoder 146, or a combination thereof, as illustrative, non-limiting examples. Additionally or alternatively, the method 400 may be performed at a data storage device associated with the memory 200 and the controller 270, such as by the read/write circuitry 202, the controller 270, or a combination thereof, as illustrative, non-limiting examples. In a particular embodiment, the method 400 is performed in response to receiving a request from the host device 150 for read access to data stored at the memory 104 of FIG. 1, or in response to receiving a request to read data from the memory 200 of FIG. 2.

The method 400 includes, at 402, reading a data value of a storage element of a resistive random access memory (ReRAM) based on a read current sensed during a first phase of a reading operation and a leakage current sensed during a second phase of the reading operation. For example, the data value and the leakage current may include or correspond to the data value 160 and the leakage current indications 162 of FIG. 1, respectively. The ReRAM may include or correspond to the memory 104 of FIG. 1 or the memory 200 of FIG. 2. The first phase of the reading operation may be associated with the first phase circuitry 112 of FIG. 1 or the first phase circuitry 262 of FIG. 2. The second phase of the reading operation may be associated with the second phase circuitry 114 of FIG. 1 or the second phase circuitry 264 of FIG. 2. The read current may be indicative of current through the storage element and current through one or more other storage elements of the ReRAM during the first phase of the reading operation. The leakage current may be indicative of current through the one or more other storage elements of the ReRAM during the second phase of the reading operation.

The method 400 also includes, at 404, determining a soft bit value by quantizing a sensed value of the leakage current. For example, the read/write circuitry 110 may quantize leakage current (e.g., via A/D circuitry, one or more sense amplifiers, other quantization circuitry, or a combination thereof) and the soft bit value may be determined by quantizing a measured value of the leakage current. The soft bit value may be determined and/or generated by the soft bit value generator 130 of FIG. 1 and/or may be associated with or correspond to the soft values 266 of FIG. 2. The soft bit value may correspond to a reliability that is selected based on the leakage current.

The method 400 also includes, at 406, providing an input value to an error correction coding (ECC) decoder, where the input value includes a hard bit value and the soft bit value, the hard bit value corresponds to the data value, and the soft bit value is at least partially based on the leakage current. For example, the input value may include or correspond to the input value 134 of FIG. 1. The ECC decoder may include or correspond to the decoder 146 of the ECC engine 140 of FIG. 1. The hard bit value may be determined based on a difference between the read current and the leakage current. In a particular implementation, the input value may indicate an erasure in response to the leakage current exceeding a leakage threshold, such as by providing an indication of zero reliability.

The method 400 may also include, at 408, generating, at the ECC decoder, a corrected data value based on the hard bit value and the soft bit value. For example, the corrected data value may include or correspond to the corrected data value 148 of FIG. 1.

Figure 5:
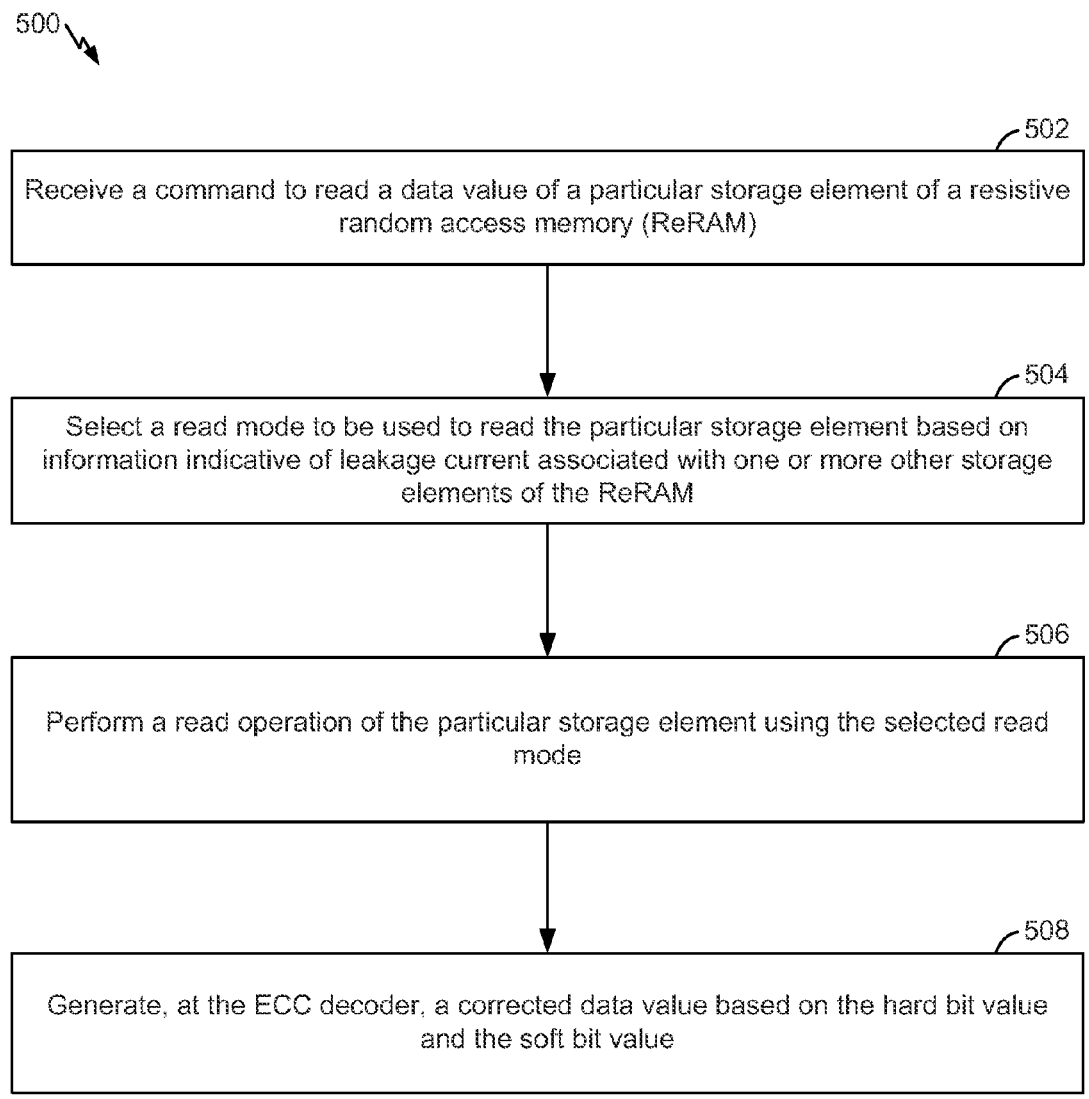
FIG. 5 is a flow diagram that illustrates another particular example of a method of operation of the data storage device of FIG. 1.

Referring to FIG. 5, a particular illustrative embodiment of a method is depicted and generally designated 500. The method 500 may be performed at the data storage device 102, such as by the read/write circuitry 110, the controller 120, the decoder 146, or a combination thereof, as illustrative, non-limiting examples. Additionally or alternatively, the method 500 may be performed at a data storage device associated with the memory 200 and the controller 270, such as by the read/write circuitry 202, the controller 270, or a combination thereof, as illustrative, non-limiting examples.

The method 500 includes, at 502, receiving a command to read a data value of a particular storage element of a resistive random access memory (ReRAM). For example, the data value may include or correspond to the data value 160 of FIG. 1. The ReRAM may include or correspond to the memory 104 of FIG. 1 or the memory 200 of FIG. 2.

The method 500 also includes, at 504, selecting a read mode to be used to read the particular storage element based on information indicative of leakage current associated with one or more other storage elements of the ReRAM. For example, the information indicative of leakage current may include or correspond to the leakage current indication 162 of FIG. 1. In some implementations, the information indicative of leakage current may include a value indicating a number of storage elements of the ReRAM that neighbor the particular storage element and that have a particular state. For example, the particular state may correspond to a low-resistance state. In other implementations, the information indicative of leakage current includes a value indicating a proportion of storage elements of the ReRAM that neighbor the particular storage element having a particular state. In other implementations, the information indicative of leakage current may indicate whether a count of the one or more storage elements having a particular state satisfies a threshold. The threshold may be satisfied when fewer than a threshold number of storage elements of the ReRAM that neighbor the particular storage element have a low resistance state.

The read mode may be selected by the read mode selector 128 and the selected read mode may include or correspond to the read mode selection 164 of FIG. 1. In some implementations, the read mode may be selected from a first read mode and a second read mode. In the first read mode, a read operation may include a leakage current detection phase and, in the second read mode, the read operation may not include a leakage current detection phase or may include leakage detection preformed at a coarser resolution as compared to the first read mode.

The method 500 also includes, at 506, performing a read operation of the particular storage element using the selected read mode. The read operation may be performed by the read/write circuitry 110 of FIG. 1 or the read/write circuitry 202 of FIG. 2. The method 500 may also include, at 508, generating, at the ECC decoder, a corrected data value based on the hard bit value and the soft bit value. For example, the ECC decoder may include or correspond to the decoder 146 of the ECC engine 140 of FIG. 1.

Figure 6:
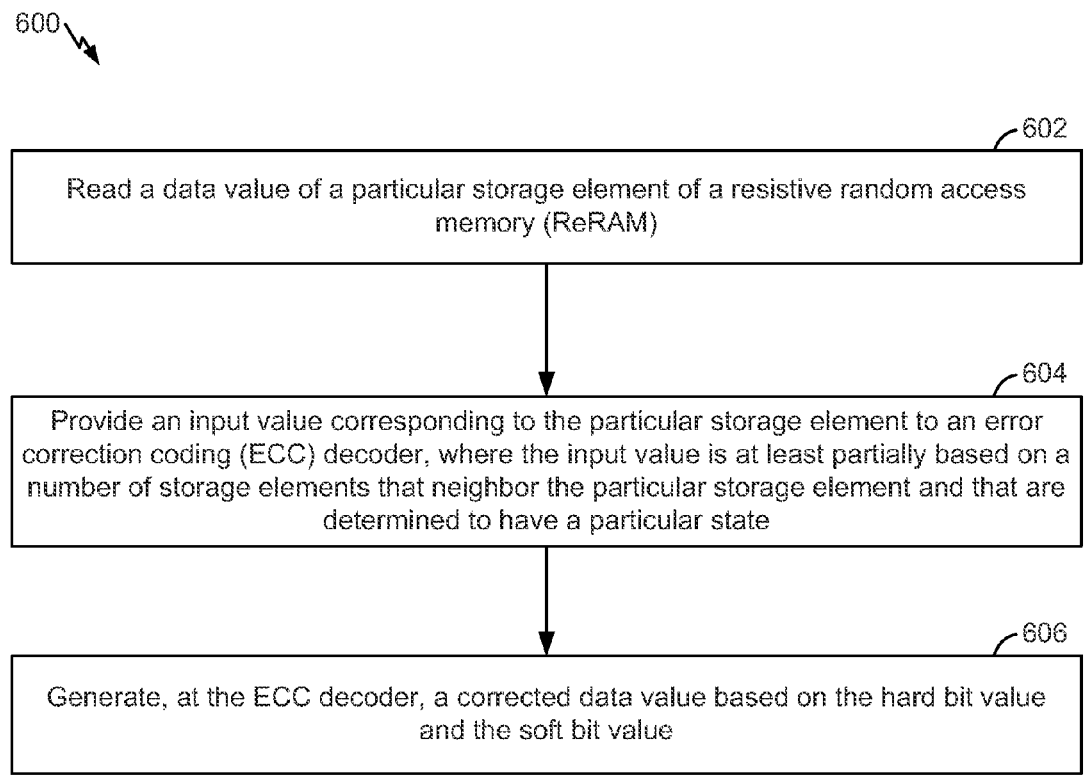
FIG. 6 is a flow diagram that illustrates another particular example of a method of operation of the data storage device of FIG. 1.

Referring to FIG. 6, a particular illustrative embodiment of a method is depicted and generally designated 600. The method 600 may be performed at the data storage device 102, such as by the read/write circuitry 110, the controller 120, the decoder 146, or a combination thereof. Additionally or alternatively, the method 600 may be performed at a data storage device associated with the memory 200 and the controller 270, such as by the read/write circuitry 202, the controller 270, or a combination thereof, as illustrative, non-limiting examples. In a particular embodiment, the method 600 is performed in response to receiving a request from the host device 150 for read access to data stored at the memory 104, or in response to receiving a request to store data at the memory 200 of FIG. 2.

The method 600 includes, at 602, reading a data value of a particular storage element of a resistive random access memory (ReRAM). For example, the data value may include or correspond to the data value 160 of FIG. 1. The ReRAM may include or correspond to the memory 104 of FIG. 1 or the memory 200 of FIG. 2. The particular state may correspond to a low-resistance state.

The method 600 also includes, at 604, providing an input value corresponding to the particular storage element to an error correction coding (ECC) decoder, where the input value is at least partially based on a number of storage elements that neighbor the particular storage element and that are determined to have a particular state. For example, the input value may include or correspond to the input value 134 of FIG. 1. The ECC decoder may include or correspond to the decoder 146 of the ECC engine 140 of FIG. 1. In some implementations, the input value may include the hard bit value and the soft bit value. For example, the hard bit value may correspond to the data value and the soft bit value may be based on the number of neighboring storage elements that are determined to have the particular state. As another example, the hard bit value may correspond to the data value and the soft bit value may be based on whether the number of neighboring storage elements that are determined to have the particular state satisfies a threshold.

The method 600 may also include, at 606, generating, at the ECC decoder, a corrected data value based on the hard bit value and the soft bit value. For example, the corrected data value may include or correspond to the corrected data value 148 of FIG. 1, and the soft bit value may be determined and/or generated by the soft bit value generator 130 of FIG. 1.

In some implementations, a read command may be received for the particular storage element as part of a sequence of read commands to sequentially read storage elements at sequential physical addresses in the ReRAM. For example, the read command may be received by the controller, such as the controller 120 of FIG. 1. One or more of the storage elements that neighbor the particular storage element may be read responsive to one or more commands of the sequence of read commands prior to reading the particular storage element. For example, the one or more storage elements that neighbor the particular storage element may be read by read circuitry, such as the read/write circuitry 110 of FIG. 1. Additionally or alternatively, in response to an ECC decoding failure of a data word that includes the data value of the particular storage element, the controller may cause the states of the neighboring storage elements to be read, such as in a heroics mode of operation.

The method 400 of FIG. 4, the method 500 of FIG. 5, and/or the method 600 of FIG. 6 may be initiated or controlled by an application-specific integrated circuit (ASIC), a processing unit, such as a central processing unit (CPU), a digital signal processor (DSP), a controller, another hardware device, a firmware device, a field-programmable gate array (FPGA) device, or any combination thereof. As an example, the method 400 of FIG. 4, the method 500 of FIG. 5, and/or the method 600 of FIG. 6 can be initiated or controlled by one or more processors, such as one or more processors included in or coupled to a controller or a memory of the data storage device 102 and/or the host device 130 of FIG. 1. A controller configured to perform the method 400 of FIG. 4, the method 500 of FIG. 5, and/or the method 600 of FIG. 6 may be able to determine storage element reliability based on read leakage current or states of neighboring storage elements.

Although various components of the data storage device 102 and the host device 150 of FIG. 1 are depicted herein are illustrated as block components and described in general terms, such components may include one or more microprocessors, state machines, or other circuits configured to enable the various components to perform operations described herein. One or more aspects of the various components may be implemented using a microprocessor or microcontroller programmed to perform operations described herein, such as one or more operations of the method 400 of FIG. 4, the method 500 of FIG. 5, and/or the method 600 of FIG. 6. In a particular implementation, each of the controller 120, the memory 104, and/or the host 150 of FIG. 1 includes a processor executing instructions that are stored at a memory, such as a non-volatile memory of the data storage device 102 or the host device 150. Alternatively or additionally, executable instructions that are executed by the processor may be stored at a separate memory location that is not part of the non-volatile memory, such as at a read-only memory (ROM) of the data storage device 102 or the host device 150 of FIG. 1.

The data storage device 102 may be attached to or embedded within one or more host devices, such as within a housing of a host communication device (e.g., the host device 150). For example, the data storage device 102 may be integrated within an apparatus such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory. However, in other embodiments, the data storage device 102 may be implemented in a portable device configured to be selectively coupled to one or more external host devices.

To further illustrate, the data storage device 102 may be configured to be coupled to the host device 150 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory 104 may include a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), a resistive random access memory (ReRAM), or a combination thereof. Alternatively or in addition, the memory 104 may include another type of memory. The memory 104 may include a semiconductor memory device.

Semiconductor memory devices include volatile memory devices, such as dynamic random access memory ("DRAM") or static random access memory ("SRAM") devices, non-volatile memory devices, such as magnetoresistive random access memory ("MRAM"), resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage device comprising:
   a resistive random access memory (ReRAM) including a plurality of storage elements, wherein a particular storage element of the ReRAM is configured to store a data value; and
   a controller coupled to the ReRAM, wherein the controller is configured to receive a command to read the data value of the particular storage element of the ReRAM and to select a read mode that includes a leakage current detection phase, wherein the read mode is selected to be used to read the particular storage element, and wherein the read mode is selected in response to more than a threshold number of storage elements of the ReRAM that neighbor the particular storage element having a particular resistance state.

2. The data storage device of claim 1, wherein the particular resistance state corresponds to a low-resistance state.

3. The data storage device of claim 1, wherein the read mode is selected from at least a first read mode and a second read mode, wherein, in the first read mode, a read operation includes the leakage current detection phase and, in the second read mode, the read operation does not include the leakage current detection phase.

4. The data storage device of claim 1, wherein the read mode is selected from at least a first read mode and a second read mode, wherein, in the first read mode, a read operation includes the leakage current detection phase performed at a first resolution, and in the second read mode, the read operation includes the leakage current detection phase performed at a second resolution.

5. The data storage device of claim 1, wherein the controller is configured to receive the command as part of a sequence of read commands to sequentially read storage elements at sequential physical addresses in the ReRAM, further comprising read circuitry configured to read one or more of the storage elements of the ReRAM that neighbor the particular storage element responsive to one or more commands of the sequence of read commands prior to reading the particular storage element.

6. A data storage device comprising:
a resistive random access memory (ReRAM) including a plurality of storage elements, wherein a particular storage element of the ReRAM is configured to store a data value;
read circuitry coupled to the particular storage element and configured to read the data value; and
a controller coupled to the read circuitry, wherein the controller is configured to receive a read command to read the data value of the particular storage element as part of a sequence of read commands to sequentially read storage elements at sequential physical addresses in the ReRAM and to provide an input value corresponding to the storage element to an error correction coding (ECC) decoder, wherein the input value indicates whether a threshold is satisfied by a count of storage elements that neighbor the particular storage element and that are read prior to reading the particular storage element and determined to have a particular state.

7. The data storage device of claim 6, wherein the particular state corresponds to a low-resistance state.

8. The data storage device of claim 6, wherein the input value includes a hard bit value and a soft bit value, and wherein the hard bit value corresponds to the data value.

9. The data storage device of claim 8, wherein the soft bit value is based on whether the count satisfies the threshold.

10. The data storage device of claim 6, wherein the read circuitry is configured to read one or more of the storage elements that neighbor the particular storage element responsive to one or more commands of the sequence of read commands prior to reading the particular storage element.

11. The data storage device of claim 10, wherein the controller is configured to cause the states of the neighboring storage elements to be read in response to an ECC decoding failure of a data word that includes the data value of the particular storage element.

12. The data storage device of claim 6, further comprising the ECC decoder, the ECC decoder configured to generate a corrected data value based on the input value.

13. A method comprising:
in a data storage device including a controller coupled to a resistive random access memory (ReRAM), performing:
receiving a command to read a data value of a particular storage element of the ReRAM; and
selecting a read mode that includes a leakage current detection phase, wherein the read mode is selected to be used to read the particular storage element and wherein the read mode is selected based on more than a threshold number of storage elements of the ReRAM that neighbor the particular storage element having a particular resistance state.

14. The method of claim 13, wherein the particular resistance state corresponds to a low-resistance state.

15. A method comprising:
in a data storage device including a controller coupled to a resistive random access memory (ReRAM), performing:
receiving a command to read a data value of a particular storage element of the ReRAM; and
selecting a read mode, from at least a first read mode and a second read mode, to read the particular storage element based on a predicted reliability of the data value, wherein the first read mode includes a leakage current detection phase performed at a first resolution and the second read mode includes a leakage current detection phase performed at a second resolution, and wherein the predicted reliability is at least partially based on a number of storage elements of the ReRAM that neighbor the particular storage element and that have a particular state.

16. The method of claim 15, wherein the particular state corresponds to a low-resistance state.

17. The method of claim 15, wherein a latency associated with the leakage current detection phase performed at the second resolution is less than a latency associated with the leakage current detection phase performed at the first resolution.

18. A method comprising:
in a data storage device including a controller coupled to a resistive random access memory (ReRAM), performing:
receiving a read command for a particular storage element of the ReRAM as part of a sequence of read commands to sequentially read storage elements at the ReRAM;
reading one or more storage elements that neighbor the particular storage element responsive to one or more read commands of the sequence of read commands prior to reading a data value from the particular storage element; and
providing an input value corresponding to the particular storage element to an error correction coding (ECC) decoder, wherein the input value is at least partially based on a threshold being satisfied by a number of the one or more storage elements that neighbor the particular storage element are determined to have a particular state.

19. The method of claim 18, wherein the particular state corresponds to a low-resistance state.

20. The method of claim 18, wherein the input value includes a hard bit value and a soft bit value, wherein the hard bit value corresponds to the data value, and wherein the soft bit value is based on the number of the one or more storage elements that are determined to have the particular state.

21. The data storage device of claim 1, wherein the controller is configured to provide an input value including a hard bit value and a soft bit value to an error correction code (ECC) decoder, wherein the soft bit value is at least partially based on a leakage current that is detected during the leakage current detection phase.

22. The data storage device of claim 21, wherein in response to the leakage current exceeding a leakage threshold, the input value indicates an erasure.

23. The method of claim 13, wherein the read mode is selected from at least a first read mode and a second read mode, wherein, in the first read mode, a read operation includes the leakage current detection phase and, in the second read mode, the read operation does not include the leakage current detection phase.

24. The method of claim 13, wherein the read mode is selected from at least a first read mode and a second read mode, wherein, in the first read mode, a read operation includes the leakage current detection phase performed at a first resolution, and in the second read mode, the read operation includes the leakage current detection phase performed at a second resolution.

25. The method of claim 13, wherein the command is received as part of a sequence of read commands to sequentially read storage elements at sequential physical addresses in the ReRAM, and further comprising, prior to reading the particular storage element, reading one or more of the storage elements of the ReRAM that neighbor the particular storage element responsive to one or more commands of the sequence of read commands.

26. The method of claim 15, further comprising providing an input value including a hard bit value and a soft bit value to an error correction code (ECC) decoder, wherein the soft bit value is at least partially based on a leakage current that is detected during the leakage current detection phase.

27. The method of claim 26, wherein in response to the leakage current exceeding a leakage threshold, the input value indicates an erasure.

28. An apparatus comprising:
means for receiving a command to read a data value of a particular storage element of a resistive random access memory (ReRAM) including a plurality of storage elements; and
means for selecting a read mode that includes a leakage current detection phase, wherein the read mode is selected to be used to read the particular storage element, and wherein the read mode is selected in response to more than a threshold number of storage elements of the ReRAM that neighbor the particular storage element having a particular resistance state.

29. The apparatus of claim 28, wherein the read mode is selected from at least a first read mode and a second read mode, wherein, in the first read mode, a read operation includes the leakage current detection phase and, in the second read mode, the read operation does not include the leakage current detection phase.

30. The apparatus of claim 28, wherein the read mode is selected from at least a first read mode and a second read mode, wherein, in the first read mode, a read operation includes the leakage current detection phase performed at a first resolution, and in the second read mode, the read operation includes the leakage current detection phase performed at a second resolution.

31. The apparatus of claim 28, the means for receiving and the means for selecting included in a controller of a data storage device, the controller coupled to the ReRAM.

32. An apparatus comprising:
means for reading a data value of a particular storage element of a resistive random access memory (ReRAM) including a plurality of storage elements;
means for receiving a read command to read the data value of the particular storage element as part of a sequence of read commands to sequentially read storage elements at sequential physical addresses in the ReRAM; and
means for providing an input value corresponding to the storage element to an error correction coding (ECC) decoder, wherein the input value indicates whether a threshold is satisfied by a count of storage elements that neighbor the particular storage element and that are read prior to reading the particular storage element and determined to have a particular state.

33. The apparatus of claim 32, wherein the input value includes a hard bit value and a soft bit value, wherein the hard bit value corresponds to the data value, and wherein the soft bit value is based on whether the count satisfies the threshold.

34. The apparatus of claim 32, wherein the means for reading is configured to read one or more of the storage elements that neighbor the particular storage element responsive to one or more commands of the sequence of read commands prior to reading the particular storage element.

35. The apparatus of claim 32, wherein the means for reading comprises read circuitry coupled to the particular storage element.

36. The apparatus of claim 32, the means for receiving and the means for providing are included in a controller of a data storage device, the controller coupled to the means for reading.

* * * * *